United States Patent [19]

Ishikawa et al.

[11] Patent Number: 5,368,684
[45] Date of Patent: Nov. 29, 1994

[54] ETCHING METHOD FOR A SILICON-CONTAINING LAYER USING HYDROGEN BROMIDE

[75] Inventors: Yoshio Ishikawa; Hiroshi Kojima, both of Tokyo; Masahito Hiratuka, Koufu, all of Japan

[73] Assignees: Tokyo Electron Limited, Tokyo; Tokyo Electron Yamanashi Limited, Nirasaki, both of Japan

[21] Appl. No.: 993,063

[22] Filed: Dec. 18, 1992

[30] Foreign Application Priority Data

Dec. 19, 1991 [JP] Japan .................. 3-336768
Jul. 8, 1992 [JP] Japan .................. 4-180963

[51] Int. Cl.⁵ ............................. H01L 21/306
[52] U.S. Cl. ..................... 156/643; 156/653; 156/657; 437/228
[58] Field of Search ............ 156/643, 653, 657; 437/225, 228

[56] References Cited

U.S. PATENT DOCUMENTS

| | | | |
|---|---|---|---|
| 4,450,042 | 5/1984 | Purdes | 156/643 |
| 4,490,209 | 12/1984 | Hartman | 156/643 |
| 4,521,275 | 6/1985 | Purdes | 156/643 |
| 4,799,991 | 1/1989 | Dockrey | 156/643 |
| 4,983,253 | 1/1991 | Wolfe et al. | 156/643 |
| 5,007,982 | 4/1991 | Tsou | 156/643 |
| 5,106,767 | 4/1992 | Comfort et al. | 437/33 |
| 5,242,536 | 9/1993 | Schoenborn | 156/643 |

FOREIGN PATENT DOCUMENTS 3-241829 10/1991 Japan .

OTHER PUBLICATIONS

Translation of Iizuka JP3-241829.

Primary Examiner—T. N. Quach
Attorney, Agent, or Firm—Oblon, Spivak, McClelland, Maier & Neustadt

[57] ABSTRACT

A magnetron discharge is generated by a high-frequency electric field and a magnetic field perpendicular to the electric field to generate a plasma of an etching gas, and an object to be processed having a silicon-containing layer represented by a polysilicon layer is exposed in the plasma to etch the silicon-containing layer. In this case, the etching gas mainly contains an HBr gas, a gas mixture of HBr and Cl₂ gases, a gas mixture of HBr and HCl gases, or a gas obtained by adding an oxygen-containing gas such as an O₂ gas to each of these gases.

2 Claims, 4 Drawing Sheets

５,３６８,６８４

ETCHING METHOD FOR A SILICON-CONTAINING LAYER USING HYDROGEN BROMIDE

BACKGROUND OF THE INVENTION

1. Field of the Invention

The present invention relates to an etching method applied to the formation of a fine circuit pattern or the like of a semiconductor device.

2. Description of the Related Art

As a conventional dry etching apparatus used in the formation of a fine circuit pattern or the like of a semiconductor device, for example, a cylindrical plasma etching apparatus, a microwave plasma etching apparatus, a parallel-plate reactive ion etching (RIE) apparatus are employed.

In recent years, a magnetron plasma etching apparatus in which a magnetron discharge is generated by a high-frequency electric field and a magnetic field perpendicular to the electric field to produce a plasma of a process gas was developed.

In the magnetron plasma etching apparatus, parallel-plate electrodes constituted by an upper electrode and a lower electrode which are opposite to each other are arranged in a vacuum chamber, and a semiconductor wafer serving as an object to be processed is mounted on the lower electrode. A high-frequency power is applied across the electrodes by a high-frequency power supply. A magnet is arranged above the vacuum chamber to generate a magnetic field perpendicular to the high-frequency electric field generated between the electrodes. The process gas is transformed into a plasma by a magnetron discharge caused by the above perpendicular electromagnetic field, and the semiconductor wafer is etched by the plasma.

In the above magnetron plasma etching apparatus, a plasma can be generated at a low pressure of, e.g., 100 mTorr or less, and a low-pressure process can be advantageously obtained.

When a silicon-containing layer such as a polysilicon layer is to be etched by using the magnetron plasma etching apparatus, a $Cl_2$ or HCl gas is singly used as a conventional etching gas.

However, when the $Cl_2$ gas or HCl gas is singly used as the conventional etching gas, and a polysilicon layer is to be etched by the magnetron plasma etching apparatus, etching of a pattern side portion caused by radicals, i.e., side etching occurs in a large quantity in a process in which the temperature of a semiconductor wafer is kept within a range of room temperature to about 100° C., and anisotropic etching cannot be preferably performed.

For this reason, in a conventional technique, low-temperature etching in which a semiconductor wafer is cooled at a low temperature of, e.g., about −30° C. to be etched is employed, thereby improving the anisotropy of etching.

However, the above low-temperature etching requires a coolant for cooling the semiconductor wafer, and an etching apparatus must have countermeasures against the low temperature, i.e., countermeasures against moisture condensation, thereby increasing the manufacturing cost of the semiconductor device.

In addition, after etching processing is performed by the above apparatus, since a semiconductor wafer cooled at a low temperature is conveyed from a vacuum chamber to a room set at the normal temperature, the $Cl_2$ gas and the like adsorbed by the semiconductor wafer cooled at the low temperature are discharged into the room as the temperature of the semiconductor wafer is increased. The discharged gas may be hazardous to human bodies. Another problem is posed, i.e., moisture condensation occurs on the surface of the semiconductor wafer.

SUMMARY OF THE INVENTION

The present invention has been made in consideration of the above circumstances, and has as its object to provide an etching method capable of preferably performing anisotropic etching without using low-temperature etching to a silicon-containing layer represented by a polysilicon layer.

It is another object of the present invention to provide an etching method which is capable of preferably performing anisotropic etching without using low-temperature etching to a silicon-containing layer represented by a polysilicon layer and has a high selection ratio of the etching rate of the silicon-containing layer to the etching rate of an $SiO_2$ film.

According to the first aspect of the present invention, there is provided a method of etching a silicon-containing layer in an object to be processed having the silicon-containing layer, comprising the steps of generating a magnetron discharge by a high-frequency electric field and a magnetic field perpendicular to the high-frequency electric field to generate a plasma of an etching gas, and exposing the object in the plasma to etch the silicon-containing layer, wherein the etching gas mainly contains an HBr gas, a gas mixture of HBr and $Cl_2$ gases, or a gas mixture of HBr and HCl gases.

According to the second aspect of the present invention, there is provided a method of etching a silicon-containing layer in an object to be processed having the silicon-containing layer, comprising the steps of generating a magnetron discharge by a high-frequency electric field and a magnetic field perpendicular to the high-frequency electric field to generate a plasma of an etching gas, and exposing the object in the plasma to etch the silicon-containing layer, wherein the etching gas mainly consists of an HBr gas, a gas mixture of HBr and $Cl_2$ gases, or a gas mixture of HBr and HCl gases and further contains an oxygen-containing gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
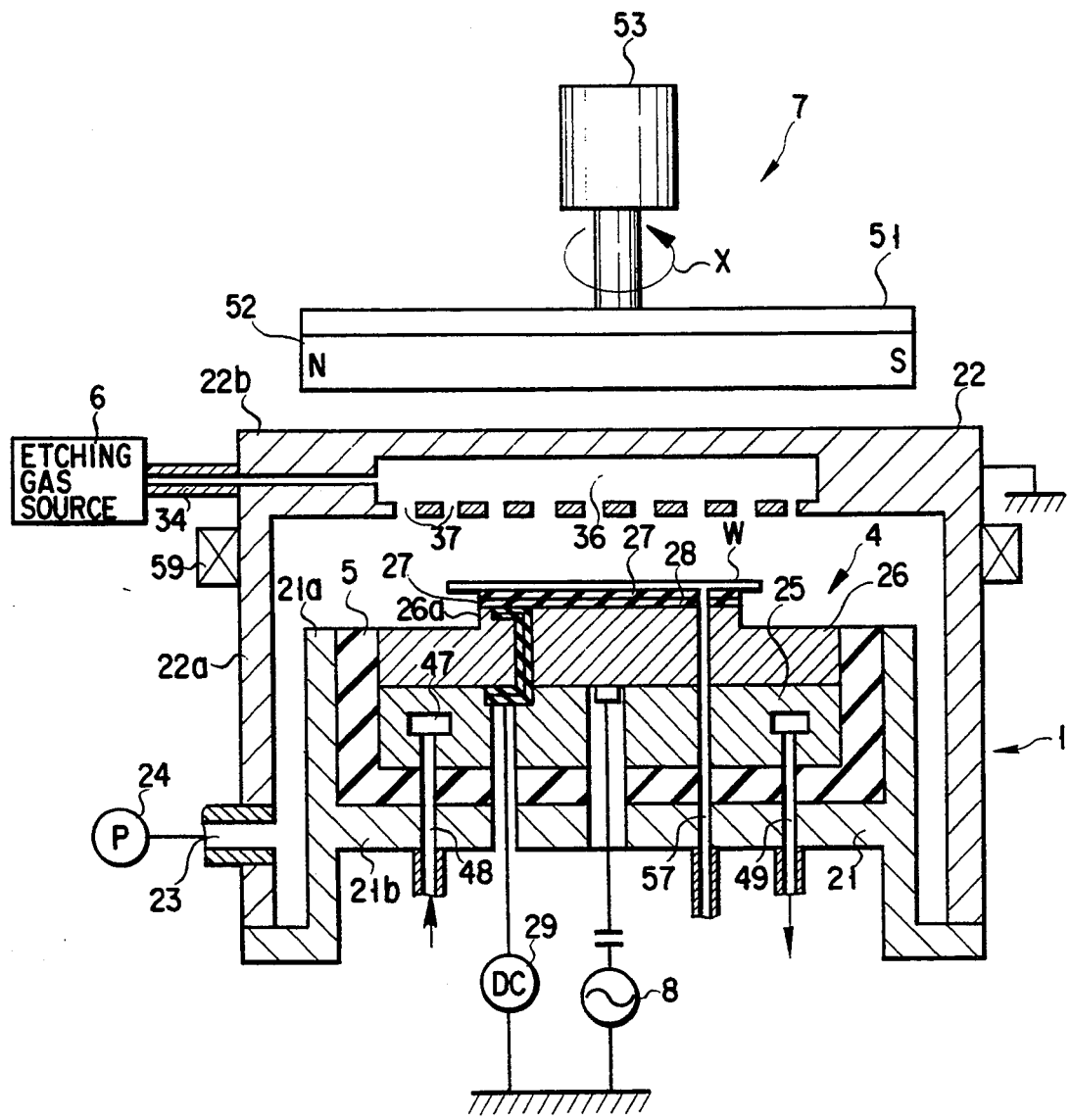
FIG. 1 is a sectional view showing an apparatus for embodying the present invention.

Preferred embodiments of the present invention will be described below.

In the present invention, a magnetron discharge is generated by a high-frequency electric field and a magnetic field perpendicular to the electric field to generate a plasma of an etching gas, and an object to be processed having a silicon-containing layer represented by a polysilicon layer is exposed in the plasma to etch the silicon-containing layer. In this case, an HBr gas, a gas mixture of HBr and $Cl_2$ gases, or a gas mixture of HBr and HCl gases as main component, or a gas obtained by adding an oxygen-containing gas such as $O_2$ gas to each of the above gases is used as an etching gas.

In this manner, when the silicon-containing layer is to be etched by magnetron plasma etching, the silicon-containing layer can be etched with preferable anisotropy by using an etching gas containing an HBr gas without performing low-temperature etching. In addition, when an oxygen-containing gas represented by $O_2$ is added to the etching gas, a selection ratio of the silicon-containing layer to an $SiO_2$ layer can be advantageously increased.

An object to be processed of the present invention comprises $SiO_2$ film and a silicon-containing layer which does not consist of $SiO_2$ and is adjacent to the $SiO_2$ film, for example, a semiconductor wafer obtained by forming a polysilicon film on an $SiO_2$ film serving as an insulating film. In this case, as the silicon-containing layer, in addition to polysilicon, silicon nitride or silicide such as WSi may be used.

A halogen-based gas contained in the etching gas mainly contains, as described above, an HBr gas, a gas mixture of HBr and $Cl_2$ gases, or a gas mixture of HBr and HCl gases. When the gas mixture of HBr and $Cl_2$ gases is used, etching having preferable anisotropy and a high selection ratio can be preferably performed. In this case, the ratio of the flow rate of the HBr gas to the flow rate of the $Cl_2$ gas is preferably set to be 20/80 or more. When the ratio falls within this range, etching having a more preferable anisotropy can be performed. In addition, the above ratio is more preferably set to be 40/60 or more. In this range, the selection ratio of the silicon-containing layer such as a polysilicon layer to $SiO_2$ can be increased.

Although the $O_2$ gas is known as an oxygen-containing gas, CO, $CO_2$, $O_3$ can also be preferably used.

In this manner, a selection ratio is increased by adding the oxygen-containing gas to the etching gas because of the following reason. That is, when $SiO_2$ is dissociated by ion bombardment caused by a plasma, oxygen in the etching gas is recombined to dissociated Si to protect the $SiO_2$ layer, thereby suppressing the etching of the $SiO_2$ layer.

The oxygen-containing gas such as an $O_2$ gas may be diluted by He. In this case, the He content is preferably 10 to 5 times the amount of $O_2$ (10 to 500%). In addition, the content of the $O_2$ gas added to the etching gas is preferably 0.5 to 2%.

An apparatus for performing the method of the present invention will be described below. FIG. 1 is a schematic view showing a magnetron plasma etching apparatus to which the present invention is applied.

The magnetron plasma etching apparatus comprises a vacuum chamber 1, a support table (susceptor) 4, arranged in the vacuum chamber 1, for supporting a object to be processed such as a semiconductor wafer W, a support table accommodating portion 5 formed of an electrically insulating ceramic, an etching gas source 6 for supplying an etching gas into the vacuum chamber 1, a magnet section 7 arranged above the vacuum chamber 1, and an RF power supply 8 connected to the support table 4.

The vacuum chamber 1 comprises a lower chamber 21 and an upper chamber 22. The lower chamber 21 is constituted by a side wall 21a which is positioned around the side wall of the support table accommodating portion 5 and a bottom wall 21b for supporting the accommodating portion 5. The upper chamber 22 is constituted by a side wall 22a which is cylindrically formed to cover the periphery of the side wall 21a of the lower chamber 21 and an upper wall 21b serving as an upper electrode. An outlet port 23 is formed at the lower portion of the side wall 22a of the upper chamber 22, and a vacuum pump 24 is connected to the outlet port 23. When the chamber 1 is evacuated by the vacuum pump 24, the pressure in the chamber 1 can be decreased to about $10^{-6}$ Torr.

A disk-like space 36 is formed inside the upper wall 22b of the upper chamber 22 so as to oppose the support table 4, and a plurality of gas diffusion holes 37 communicating with the space 36 are formed to extend to the vacuum chamber 1. The space 36 communicates with the etching gas source 6 through a gas supply hole 35 and a gas supply pipe 34, and the above etching gas is supplied from the etching gas source 6 to a plasma forming region in the vacuum chamber 1 through the gas supply pipe 34, the gas supply hole 35, the space 36, and the gas diffusion holes 37. Note that a means for heating the process gas to the normal temperature or more is arranged as needed, and the etching gas may be supplied through the heating means.

Figure 2:
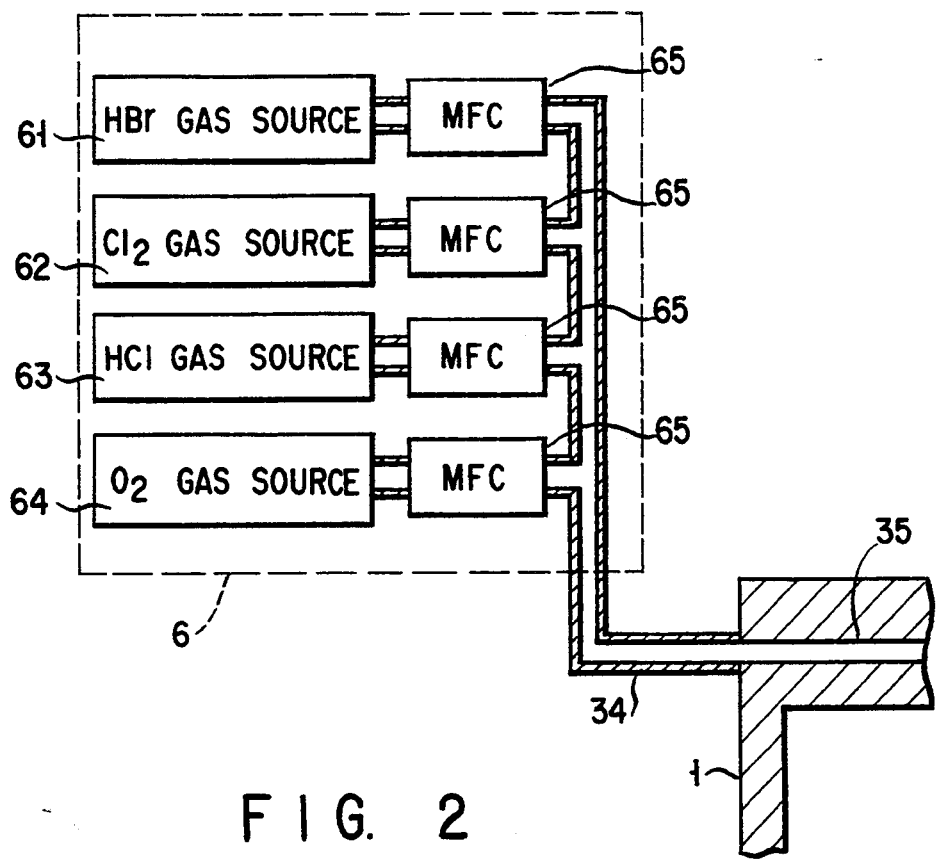
FIG. 2 is a view showing a supply system for supplying an etching gas to the apparatus in FIG. 1.

The etching gas source 6, as shown in FIG. 2, comprises an HBr gas source 61, a $Cl_2$ gas source 62, an HCl gas source 63, an $O_2$ gas source 64, and mass flow controllers 65 arranged to these gas sources. The etching gas source 6 supplies the gases into the chamber 1 in a desirable combination at corresponding predetermined flow rates.

The support table 4 comprises a lower member 25 and an upper member 26 detachably arranged to the lower member 25. The upper member 26 has a disk-like projection portion 26a at its central portion, and an electrostatic attraction sheet 27 is formed on the projection portion 26a. A wafer W is fixed on the projection portion 26a of the upper member 26 through the electrostatic attraction sheet 27 by Coulomb's force. The electrostatic attraction sheet 27 has an insulating sheet 27a of polyimide and a conductive sheet 28 of copper and buried in the insulating sheet 27a, and the conductive sheet 28 is connected to a DC power supply 29.

A circular liquid path 47 for adjusting the temperature of the semiconductor wafer W is formed in the lower member 25, and liquid outlet paths 48 and 49 are connected to the liquid path 47. A liquid having a predetermined temperature is supplied to the liquid path 47 at a proper flow rate to control the temperature of the wafer W.

The RF power supply 8 is connected to the upper member 26 of the support table 4 serving as a lower electrode. The upper wall 22b serving as an upper electrode is grounded. The upper wall 22b and the support table 4 serving as the lower electrode connected to the RF power supply 8 constitute a pair of parallel-plate electrodes, and a high-frequency electric field is generated between the parallel-plate electrodes.

A magnet section 9 comprises a support member 51 horizontally arranged immediately above the vacuum chamber 1, a permanent magnet 52 supported by the support member 51, and a motor 53 for rotating the support member 51 and the permanent magnet 52 in a direction of an arrow X in FIG. 1. In this manner, a uniform parallel magnetic field is generated above the surface of the wafer W. A magnetron discharge is generated by a crossed electromagnetic field obtained by the parallel magnetic field and the high-frequency electric field between the upper wall 22b and the support table 4, thereby generating a plasma of the etching gas.

A heat-transfer gas from a supply source (not shown) is supplied between the upper member 26 and the wafer W serving as an object to be processed through a gas hole 57 extending through the upper member 26, the lower member 25, and the bottom wall of the support table accommodating portion 5. A heat transfer rate between the support table 4 and the wafer W is increased by the heat-transfer gas, and the temperature of the wafer W can be more accurately controlled. In order to achieve the above purpose, a gas having a high heat transfer rate is preferably used as the heat-transfer gas, and the heat-transfer gas which does not adversely affect the etching reaction must be used. From this point of view, an He, $O_2$, Ar, or $N_2$ gas is preferably used, and more particularly, the He gas is most preferably used.

Reference numeral 59 denotes a heater for heating the vacuum chamber 1 to 50° to 120° C. When the chamber 1 is heated by the heater 59, reaction products can be prevented from being adhered and deposited in the chamber 1.

In order to perform etching by the apparatus arranged as described above, the wafer W serving as an object to be processed is conveyed from a load lock chamber (not shown) adjacent to the vacuum chamber 1 into the vacuum chamber 1 and is loaded on the electrostatic attraction sheet 27. A DC voltage of 2 kV is applied to the conductive sheet 28.

Thereafter, the vacuum chamber 1 is evacuated such that the pressure in the vacuum chamber 1 is set to be 0.1 to 10 mTorr. The etching gas having the above composition Is supplied from the etching gas source 7 to a plasma forming region in the vacuum chamber 1 through the gas supply pipe 34, the gas supply hole 35, the space 36, and the gas diffusion holes 37. In this state, the RF power supply 8 supplies a high-frequency power between the support table 4 and the upper wall 22b serving as the upper electrode. At this time, since the high-frequency power is directly supplied to the upper member 26 of the support table 4, a voltage of −70 to −100 V is applied to the wafer W. On the other hand, the magnet 52 applies a horizontal magnetic field between these electrodes. Therefore, a crossed electromagnetic field is formed above the surface of the wafer W, and a magnetron discharge is excited on the surface of the wafer W. Since the magnet 52 is rotated, the magnetron discharge is uniformly excited. In the magnetron discharge, electrons located between the electrodes are subjected to cyclotron motion, and the electrons collide with molecules to increase the number of times of molecular ionization. Even at a relatively low pressure of $10^{-2}$ to $10^{-3}$ Torr order, a high etching rate of 1 μm/min can be obtained. In addition, the discharge cannot only allow etching under the low pressure but also allow more vertical etching. Note that the Coulomb's force of the electrostatic attraction sheet 27 is generated by the generation of the plasma, and the target object W is attracted.

In this case, since the etching gas mainly containing an HBr gas, a gas mixture of HBr and $Cl_2$ gases, or a gas mixture of HBr and HCl gases is used, the silicon-containing layer can be preferably anisotropically etched without performing low-pressure etching. In addition, when the oxygen-containing gas represented by an $O_2$ gas is added to the etching gas, not only the anisotropy is preferable, but also a selection ratio of the silicon containing film to an $SiO_2$ layer is increased.

Examples of the present invention will be described below.

EXPERIMENTAL EXAMPLE 1

Figure 3:
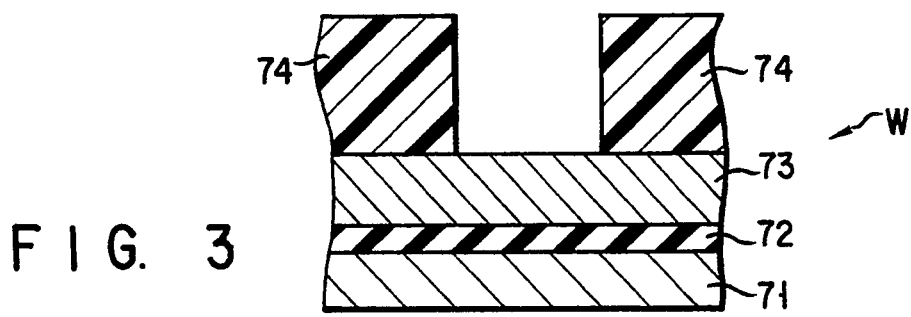
FIGS. 3 to 5 are sectional views for explaining the etching states of a wafer.

In Experimental Example 1, the semiconductor wafer W shown in FIG. 3 was used as an object to be processed, and the semiconductor wafer was etched by the apparatus shown in FIG. 1. The semiconductor wafer W was obtained as follows. That is, an $SiO_2$ layer 72 and a polysilicon layer 73 were sequentially formed on an Si substrate 71, and a patterned resist layer 74 was formed thereon. In this example, the polysilicon layer 73 was etched using the resist layer 74 as a mask with the following procedures.

The semiconductor wafer W was mounted on the support table 4 serving as a lower electrode, the pressure of the chamber 1 was kept at 75 mTorr by the vacuum pump 24, and an HBr gas was supplied from the HBr gas source 61 to the chamber 1 at a flow rate of 100 SCCM. In this state, the RF power supply 8 supplied a 200-W high-frequency power having a frequency of 13.56 MHz between the upper wall 22b and the support table 4 serving as the upper and lower electrodes, and the permanent magnet 52 was rotated at 20 rpm, thereby performing etching processing. At this time, the temperature of the semiconductor wafer W was set to be 70° C.

Figure 4:
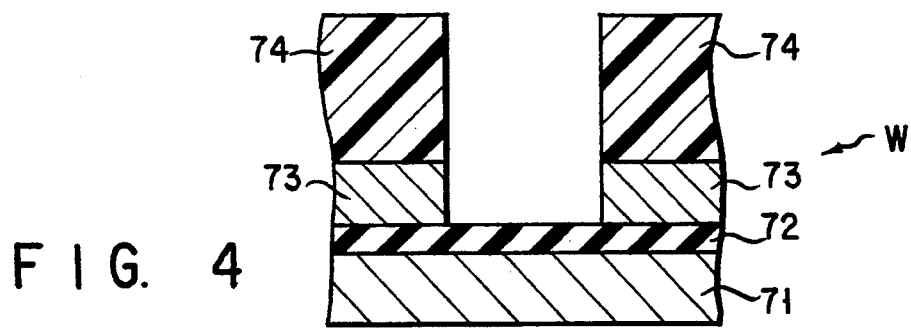

When the etched semiconductor wafer W was observed with a microscope, it was confirmed that the polysilicon layer 72 was preferably anisotropically etched without side etching, as shown in FIG. 4.

Figure 5:
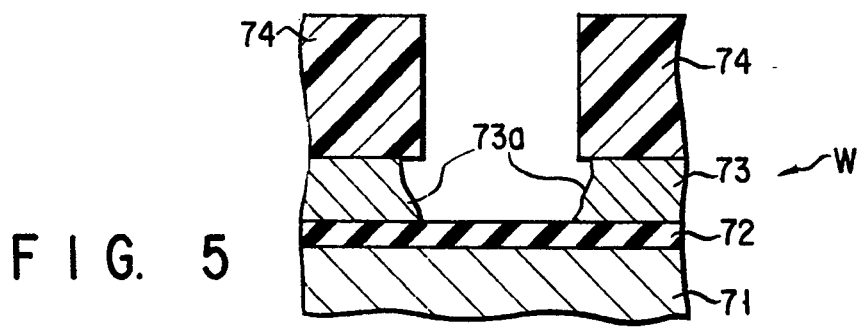

Next the total flow rate of the HBr and $Cl_2$ gases was set to be 100 SCCM, and gas mixtures obtained by changing the flow rates of these gases every 20 SCCM at a time were used, and etching processing was performed under the same conditions as described above. As a result, even when the flow rate of the HBr gas was decreased to 20 SCCM, as in a case wherein the HBr gas only was used as the etching gas, etching having a high anisotropy could be performed. In contrast to this, when the HBr gas was not used (i.e., the flow rate of the $Cl_2$ gas was set to be 100 SCCM), and the etching was performed under the same conditions as described above, it was confirmed that a side-etched portion 73a was formed at each side wall portion of the polysilicon layer 73, as shown in FIG. 5.

Figure 6:
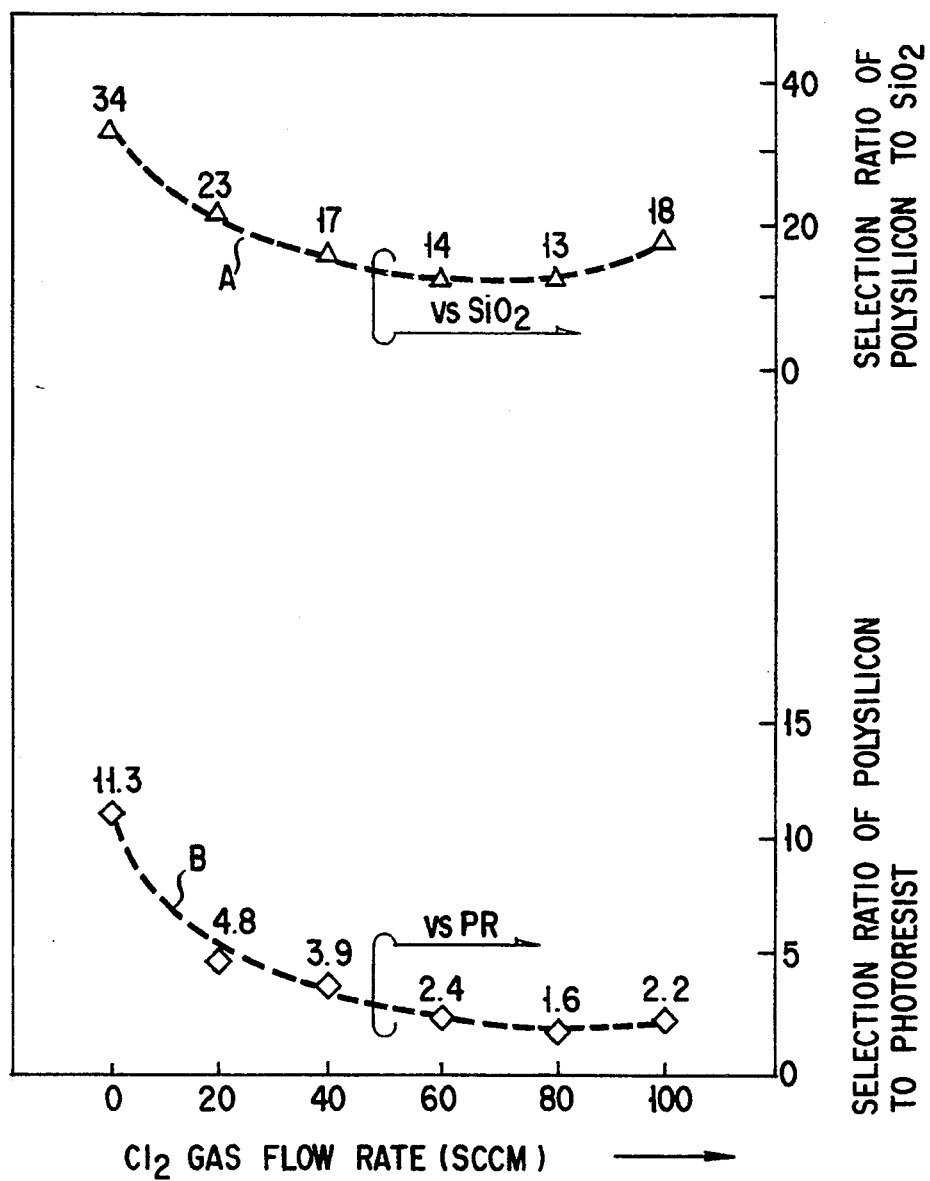
FIG. 6 is a graph showing a relationship between a $Cl_2$ flow rate and selection ratios of polysilicon to $SiO_2$ and a photoresist when a gas mixture of HBr and $Cl_2$ gases is used as an etching gas.

Selection ratios of polysilicon to SiO$_2$ and a photoresist in the above etching processing were grasped. The selection ratios are shown in FIG. 6. FIG. 6 is a graph showing a relationship between the flow rate of the Cl$_2$ gas and the selection ratios. In FIG. 6, the abscissa represents the flow rate of the Cl$_2$ gas, and the ordinate represents the selection ratios. In this case, the flow rate of the HBr gas is given by subtracting the flow rate of the Cl$_2$ gas from 100. In FIG. 6, a curve A represents the selection ratio of polysilicon to the SiO$_2$ layer 72 (etching rate of polysilicon/etching rate of SiO$_2$), and a curve B represents a selection ratio of polysilicon to a photoresist (etching rate of polysilicon/etching rate of photoresist).

As shown in the graph, when the flow rate of the Cl$_2$ gas was 60 SCCM or less, i.e., when the flow rate of HBr gas was 40 SCCM or more, polysilicon could be etched at higher selection ratios of polysilicon to SiO$_2$ and a photoresist than those of a case wherein only the Cl$_2$ gas was used as an etching gas. That is, when the concentration of the HBr gas in the etching gas was set to be 40% or more, it was confirmed that high selection ratios could be obtained.

In the above example, the case wherein only the HBr gas was used as the etching gas and the case wherein the gas mixture of the HBr and Cl$_2$ gases was used have been described above. However, when a gas mixture of HBr and HCl gases is used, anisotropic etching can be preferably performed.

EXPERIMENTAL EXAMPLE 2

In this example, the magnetron etching apparatus shown in FIG. 1 was used, a gas mixture obtained by adding an O$_2$ gas to an HBr gas was used, and the semiconductor wafer shown in FIG. 3 was etched.

In Experimental Example 2, the pressure of the chamber 1 was set to be 75 mTorr, the flow rate of the HBr gas was set to be 100 SCCM, the frequency of a high-frequency power was set to be 13.56 MHz, a power was set to be 200 W, and the rotational speed of the permanent magnet was set to be 20 rpm.

Figure 7:
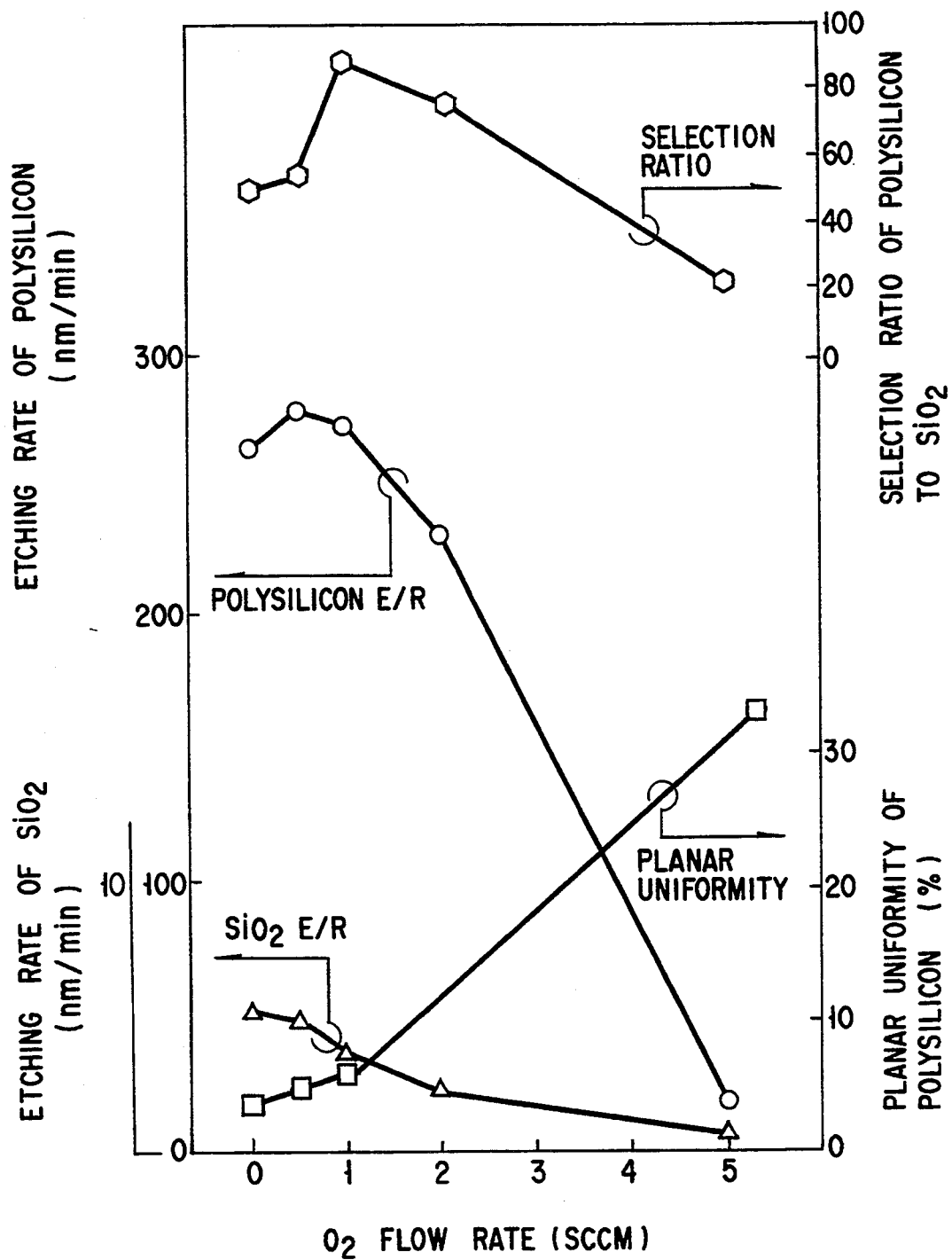
FIG. 7 is a graph showing the etching rate of polysilicon, the etching rate of $SiO_2$, the selection ratio of polysilicon to $SiO_2$, and planar uniformity of polysilicon when a gas mixture of HBr and $Cl_2$ gases is used as an etching gas and the flow rate of an $O_2$ gas is changed.

The results of the above etching are shown in FIG. 7. FIG. 7 shows the etching rate of polysilicon, the etching rate of SiO$_2$, the selection ratio of polysilicon to SiO$_2$, and planar uniformity of polysilicon when the flow rate of the O$_2$ gas is changed. As is apparent from the graph in FIG. 7, it was confirmed that the selection ratio of polysilicon to SiO$_2$ was slightly increased when the flow rate of the O$_2$ gas was set to be 0.5 SCCM, and it was confirmed that the selection ratio had the peak value of 92 when the flow rate of the O$_2$ gas was set to be 1 SCCM. In addition, it was confirmed that the high selection ratio of 72 could be obtained even when the flow rate of the O$_2$ gas was set to be about 2 SCCM. As is apparent from the graph, in the above case, the etching rate of polysilicon had a large value of 200 nm/min or more, the etching rate of SiO$_2$ had a small value of 4.0 nm/min, the planar uniformity of polysilicon had a preferable value of 7 to 12%.

As described above, when etching processing was performed by using an etching gas obtained by adding the O$_2$ gas to the HBr gas, it was confirmed that a high etching rate of polysilicon could be obtained while the selection ratio of polysilicon to SiO$_2$ was kept high. More specifically, a case wherein no O$_2$ gas was added was compared with a case wherein the O$_2$ gas was added at a flow rate of 1 SCCM, the selection ratio of polysilicon to SiO$_2$ was increased from 50 to 92, the etching rake of polysilicon was slightly increased from 270 nm/min to 275 nm/min, and the etching rate of SiO$_2$ was decreased from 5.4 nm/min to 3.0 nm/min. On the other hand, although the planar uniformity of polysilicon was slightly degraded from about 4% to 7%, the uniformity could be kept preferable.

According to the above results, it was confirmed that the O$_2$ gas was preferably added to the HBr gas at a flow rate of 0.5 to 2 SCCM, i.e., 0.5 to 2%.

In the above examples, although a case wherein the O$_2$ gas is added to the HBr gas has been described. However, when O$_2$ gas is added to a gas mixture of HBr and Cl$_2$ gases, and an O$_2$ gas is added to a gas mixture of HBr and HCl gases, the same preferable results as those in Experimental Examples 1 and 2 can be obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of etching a silicon-containing layer in an object to be processed having said silicon-containing layer, comprising the steps of:

generating a magnetron discharge by a high-frequency electric field and a magnetic field perpendicular to the high-frequency electric field to generate a plasma of an etching gas; and exposing said object in the plasma to etch said silicon-containing layer, wherein the etching gas mainly contains a gas mixture of HBr and Cl$_2$ gases, and wherein a ratio of a flow rate of the HBr gas to a flow rate of the Cl$_2$ gas is not less than 40/60.

2. A method according to claim 1, wherein said silicon-containing layer is a polysilicon layer.

* * * * *